US007956651B2

(12) United States Patent
Ptacek et al.

(10) Patent No.: US 7,956,651 B2
(45) Date of Patent: Jun. 7, 2011

(54) METHOD FOR DETECTING A CURRENT AND COMPENSATING FOR AN OFFSET VOLTAGE AND CIRCUIT

(75) Inventors: Karel Ptacek, Roznov Pod Radhostem (CZ); Roman Stuler, Karolinka (CZ); Frantisek Sukup, Zasova (CZ)

(73) Assignee: Semiconductor Components Industries, LLC, Phoenix, AZ (US)

( * ) Notice: Subject to any disclaimer, the term of this patent is extended or adjusted under 35 U.S.C. 154(b) by 54 days.

(21) Appl. No.: 12/557,206

(22) Filed: Sep. 10, 2009

(65) Prior Publication Data
US 2011/0057704 A1 Mar. 10, 2011

(51) Int. Cl.
*H03K 5/22* (2006.01)
(52) U.S. Cl. ............... 327/74; 327/75; 327/76; 327/307
(58) Field of Classification Search .............. 327/74–76, 327/307, 540–541
See application file for complete search history.

(56) References Cited

U.S. PATENT DOCUMENTS

| | | | | |
|---|---|---|---|---|
| 4,859,873 A | * | 8/1989 | O'Shaughnessy et al. | 327/74 |
| 5,210,527 A | * | 5/1993 | Smith et al. | 340/659 |
| 5,488,322 A | * | 1/1996 | Kaplinsky | 327/74 |
| 5,614,857 A | * | 3/1997 | Lim et al. | 327/205 |
| 5,969,557 A | * | 10/1999 | Tanzawa et al. | 327/291 |
| 6,031,389 A | * | 2/2000 | Fotouhi et al. | 326/31 |
| 6,418,039 B2 | | 7/2002 | Lentini et al. | |
| 7,183,834 B2 | | 2/2007 | Nadd et al. | |

OTHER PUBLICATIONS

On Semiconductor, Secondary Side Synchronous Flyback Controller, NCP402 Data Sheet, Feb. 2008—Rev. 2, Semiconductor Components Industries, L.L.C., 2008.

* cited by examiner

*Primary Examiner* — Kenneth B. Wells
(74) *Attorney, Agent, or Firm* — Rennie William Dover

(57) ABSTRACT

A method and circuit for detecting a current and compensating for an offset voltage. The circuit includes two comparators where one of the comparators has two input terminals and the other comparator has three input terminals. An input terminal of each of the two comparators are commonly connected together, the other input terminal of the two-input comparator is coupled for receiving a first reference voltage, and a second input terminal of the three-input comparator is coupled for receiving a second reference voltage. During a first portion of the period of a sense signal the two comparators operate in a sensing mode and during a second portion of the period of the sense signal the comparator having the three input terminals operate in a current nullification mode or an offset voltage compensation mode. An offset compensation signal is generated during the second portion of the sense signal.

29 Claims, 3 Drawing Sheets

METHOD FOR DETECTING A CURRENT AND COMPENSATING FOR AN OFFSET VOLTAGE AND CIRCUIT

TECHNICAL FIELD

The present invention relates, in general, to power supplies and, more particularly, to switching mode power supplies.

BACKGROUND

Switching Mode Power Supplies (SMPS) are used in a variety of portable electronic devices including laptop computers, cellular phones, personal digital assistants, video games, video cameras, etc. They may convert a dc signal at one voltage level to a dc signal at a different voltage level (this is a dc-dc converter), an Alternating Current (ac) signal to a dc signal (this is an ac-dc converter), a dc signal to an ac signal (this is a dc-ac converter), or an ac signal to an ac signal (this is an ac-ac converter). In many applications, power converters have standby power guidelines that specify the amount of power they can consume. As these guidelines become more stringent, power converter manufacturers are faced with improving the active mode efficiency during light load conditions and during no-load conditions. For example, power consumption guidelines for power converters are fast approaching the specification of consuming less than 100 milliwatts when left connected to the mains in a no-load condition.

Today's high efficiency SMPSs use synchronous rectification to achieve the desired efficiency in their power stage. A controller using synchronous rectification controls a MOSFET switch that bypasses a standard rectifier for most of its conduction time. The MOSFET is typically referred to as an SR MOSFET switch. The SR MOSFET switch is used as a bypass element because it has a lower voltage drop compared to a standard diode or a Schottky rectifier. This lower voltage drop decreases the power loss and increases the efficiency of the SMPS power stage. In a zero current detection method the voltage drop between the drain and the source of the SR MOSFET is used to determine when to turn on or turn off the SR MOSFET. In this technique, the turn-on and turn-off threshold of the secondary current is usually equal to or near zero. Because the turn-off voltage between the drain and the source of an SR MOSFET is equal to or near zero, offsets in a current sense comparator can cause a significant turn-off current error. Another drawback is that the propagation delay of the current sense comparator should be as low as possible to turn off the SR MOSFET in a timely fashion, i.e., as soon as possible after detection of a zero current condition.

One technique for detecting a zero current condition involves the use of two comparators, where one detects the turn-on threshold voltage and the other detects the turn-off threshold voltage. Drawbacks with this technique include the need for isolated pnp bipolar transistors in the differential input stage to have a small input offset voltage and a low propagation delay, imprecision, and the need for an additional input/output pin for setting the turn-off threshold voltage.

Accordingly, it would be advantageous to have a circuit and a method for detecting a zero current condition, providing offset nullification, and capable of setting the turn-off threshold voltage without increasing the number of input/output pins. It would be of further advantage for the circuit and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

DETAILED DESCRIPTION

Figure 1:
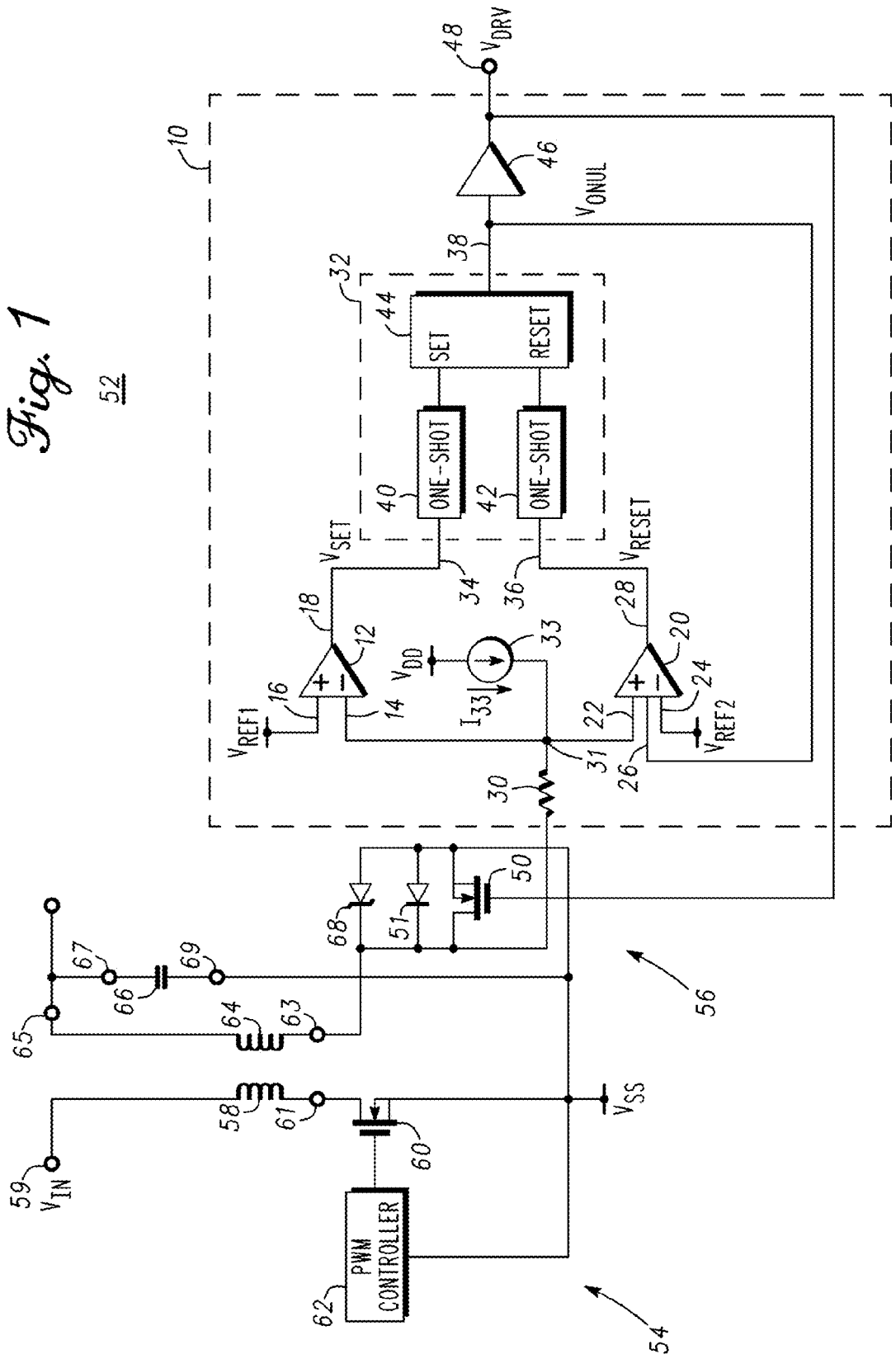
FIG. 1 is a circuit schematic of a zero current detection circuit having offset nullification in accordance with an embodiment of the present invention.

FIG. 1 is a schematic diagram of a current detector circuit with offset nullification 10 in accordance with an embodiment of the present invention. Current detector circuit 10 comprises comparators 12 and 20 connected to a logic circuit 32. Comparator 12 has an inverting input terminal 14, a non-inverting input terminal 16 coupled for receiving a reference voltage $V_{REF1}$ and an output terminal 18 connected to an input terminal 34 of logic circuit 32. Comparator 20 has a non-inverting input terminal 22, an inverting input terminal 24 coupled for receiving a reference voltage $V_{REF2}$, an input terminal 26, and an output terminal 28 connected to an input terminal 36 of logic circuit 32. Non-inverting input terminal 22 is connected to inverting input terminal 14 and to a terminal of a current source 33 to form a sensing node 31. By way of example, current source 33 sources a current $I_{33}$ of 100 micro-amperes (µA). It should be noted that sensing node 31 may serve as an input/output pin that is a sensing pin or may be coupled to an input/output pin that serves as a sensing pin. Although a reference to an operating supply $V_{SS}$ is not shown for current detector circuit 10, it should be noted that current detector circuit 10 and references $V_{REF1}$ and $V_{REF2}$ are preferably referenced to operating supply $V_{SS}$, which may be a ground signal.

Logic circuit 32 comprises a one-shot 40 having an input terminal that serves as input terminal 34 of logic circuit 32 and an output terminal that is connected to the SET input terminal of a latch 44. Logic circuit 32 further comprises a one-shot 42 having an input terminal that serves as input terminal 36 of logic circuit 32 and an output terminal that is connected to the RESET input terminal of latch 44. The output terminal of latch 44 serves as an output terminal 38 of logic circuit 32. Output terminal 38 is connected to input terminal 26 of comparator 20. In addition, output terminal 38 is connected to the input terminal of a driver 46. Output terminal 48 of driver 46 serves as the output terminal of current detector circuit 10. Preferably, comparators 12 and 20, logic circuit 32, current source 33, and driver 46 are formed in a single semiconductor chip. As those skilled in the art are aware, semiconductor chips are formed from a semiconductor substrate such as, for example, a silicon substrate. Accordingly, current $I_{33}$ flows out of the semiconductor chip from which comparators 12 and 20 and current source 33 are manufactured through sensing node 31.

Current detector circuit 10 is suitable for use in determining when a Synchronous Rectification (SR) transistor on a secondary side of a Switching Mode Power Supply (SMPS) is to be turned on or turned off. By way of example, SR transistor 50 is a Metal Oxide Semiconductor Field Effect Transistor (MOSFET) having a body diode 51. Accordingly, sensing node 31 of current detector 10 is coupled to the drain terminal of an SR MOSFET 50 that is on the secondary side 56 of SMPS 52. For the sake of completeness, FIG. 1 illustrates the primary side 54 and the secondary side 56 of an SMPS 52. Primary side 54 includes a coil or inductor 58 having a terminal 59 coupled for receiving an input voltage $V_{IN}$, and a terminal 61 connected to the drain terminal of a switching transistor 60. The source terminal of switching transistor 60 is coupled for receiving a source of operating potential such as, for example, operating potential $V_{SS}$, and the gate terminal of switching transistor 60 is connected to a Pulse Width Modulation (PWM) controller 62. By way of example, source of operating potential $V_{SS}$ is a ground potential. Secondary side 56 of SMPS 52 includes a coil or inductor 64 having a terminal 65 connected to a terminal 67 of an output capacitor 66 and a terminal 63 commonly connected to a cathode terminal of a Schottky diode 68 and to a drain terminal of SR MOSFET 50. The anode of Schottky diode 68 is connected to the source terminal of SR MOSFET 50 and to a terminal 69 of output capacitor 66. Output terminal 48 of driver 46 is connected to the gate terminal of SR MOSFET 50. Alternatively, Schottky diode 68 may be replaced by a rectifier such as for example, a junction diode. It should be noted that Schottky diode 68 is an optional element that is placed in parallel with the body diode of SR MOSFET 50 to decrease the stress across SR MOSFET 50 when its body diode is conducting but SR MOSFET 50 has not turned on yet or when controller 62 is not turned on because of a light load. When there is a light load, because of switching losses it is more efficient for the body diode or the Schottky diode to conduct instead of turning on SR MOSFET 50. A light load occurs when the load resistance connected between node 65 and source of operating potential $V_{SS}$ is so large that the output current is low and thermal losses from the body diode or the Schottky diode are negligible.

Figure 2:
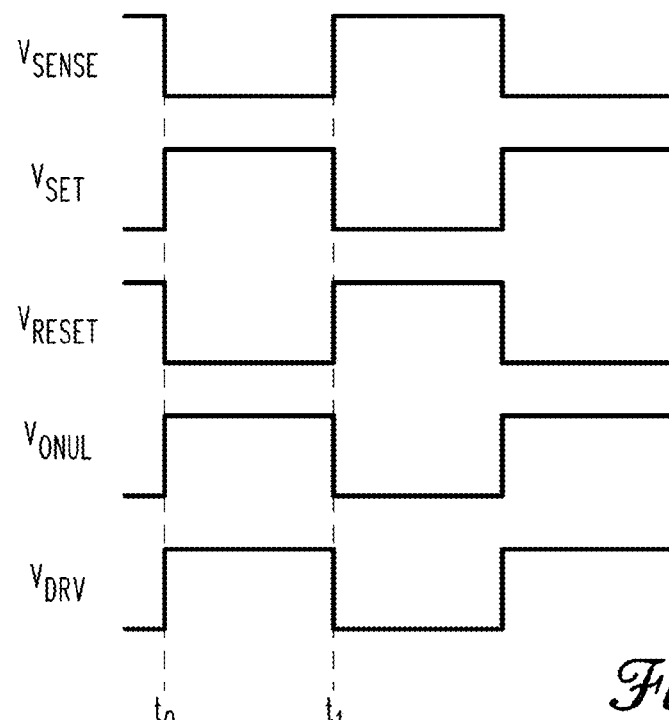
FIG. 2 is a timing diagram for the zero current detection circuit of FIG. 1.

FIG. 2 is a timing diagram 80 of the operation of current detector circuit 10 in accordance with an embodiment of the present invention. What is shown in FIG. 2 is the voltage waveform $V_{SENSE}$ appearing at sensing node 31, the voltage waveform $V_{SET}$ appearing at output terminal 18, the voltage waveform $V_{RESET}$ appearing at output terminal 28, the offset nullification signal $V_{ONUL}$ appearing at input terminal 26 and output terminal 28, and voltage waveform $V_{DRV}$ appearing at output terminal 48. In operation, at time $t_0$ body diode 51 of SR MOSFET 50 is conducting and the drain voltage of SR MOSFET 50 is at a value that is substantially equal to the forward voltage of body diode 51. In response to the drain voltage being substantially equal to the forward voltage of body diode 51, voltage $V_{SENSE}$ appearing at sensing node 31 is substantially equal to the sum of the forward voltage of body diode 51 and the voltage across sense resistor 30. The voltage across sense resistor 30 is generated by current $I_{33}$ flowing through sense resistor 30, i.e., the voltage across sense resistor 30 is the product of current $I_{33}$ and the resistance value of resistor 30. During a first portion of the period of sense voltage $V_{SENSE}$, which appears at sensing node 31, comparator 12 compares voltage $V_{SENSE}$ with reference voltage $V_{REF1}$ and generates a comparison signal or voltage $V_{SET}$ that is transmitted from output terminal 18 to input terminal 34. In response to voltage $V_{SET}$ being at a logic high voltage level, an offset nullification signal $V_{ONUL}$ which appears at output terminal 38 of logic circuit 32 is also at a logic high voltage level. Offset nullification signal $V_{ONUL}$ is also referred to as an activation signal $V_{ACT}$. In response to offset nullification signal $V_{ONUL}$ being at a logic high voltage level, output signal $V_{DRV}$ which appears at output terminal 48 of driver 46 is also at a logic high voltage level, which turns on SR MOSFET 50. Thus, comparator 12 is referred to as a turn-on comparator. With SR MOSFET 50 turning on, comparator 20 compares the voltage at node 31 with reference voltage $V_{REF2}$. When the voltage at node 31 becomes greater than reference voltage $V_{REF2}$, comparator 20 resets latch 44 and SR MOSFET 50 is turned off. In the next cycle, SR MOSFET 50 will be turned on by turn-on comparator 12. During this portion of voltage sense signal $V_{SENSE}$, offset nullification is performed. It should be noted that the voltage at the drain of SR MOSFET 50 is negative with respect to ground during a turn on event. Although the voltage across body diode 51 or a standard rectifier diode would be about a negative 700 millivolts, the voltage is about negative 50 millivolts. Thus, the losses are much lower.

Offset nullification signal $V_{ONUL}$ appearing at output terminal 38 of logic circuit 32 is transmitted to input terminal 26 of comparator 20 and voltage signal $V_{DRV}$ appearing at output terminal 48 is transmitted to the gate terminal of SR MOSFET 50. When voltage $V_{DRV}$ is at a logic high voltage level, the voltage appearing at the gate terminal of SR MOSFET 50 is also at a logic high voltage level maintaining SR MOSFET 50 in a conduction mode. When offset nullification signal $V_{ONUL}$ is at a logic high voltage level, the voltage appearing at control terminal 26 is also at a logic high voltage level, which activates comparator 20 so that it is operating in a sensing mode. In the sensing mode, comparator 20 compares sense signal $V_{SENSE}$ appearing at sensing node 31 with reference voltage $V_{REF2}$ and generates a comparison signal $V_{RESET}$ at output terminal 28. Because the voltage at sensing node 31 is less than reference voltage $V_{REF2}$, comparison signal $V_{RESET}$ generated at output terminal 28 by comparator 20 is at a logic low voltage level.

At time $t_1$, the current flow through SR MOSFET 50 and body diode 51 are substantially zero, thus the voltage at the drain terminal of SR MOSFET 50 is greater than reference voltages $V_{REF1}$ and $V_{REF2}$. Accordingly, comparison signal $V_{SET}$ generated by comparator 12 at output terminal 18 is at a logic low voltage level and comparison signal $V_{RESET}$ generated by comparator 20 at output terminal 28 is at a logic high voltage level. In response to comparison signal $V_{SET}$ being at a logic low voltage level and comparison signal $V_{RESET}$ being at a logic high voltage level, offset nullification signal $V_{ONUL}$ generated at output terminal 38 by logic circuit 32 and voltage $V_{DRV}$ generated at output terminal 48 by driver 46 are at logic low voltage levels. Offset nullification signal $V_{ONUL}$ being at a logic low voltage level changes the operating mode of comparator 20 from a sensing mode to an input offset current nullification mode and voltage signal $V_{DRV}$ being at a logic low voltage level turns off SR MOSFET 50. Thus, comparator 20 may be referred to as a turn-off comparator. During the input offset current nullification mode, i.e., when offset nullification signal $V_{ONUL}$ is at a logic low voltage level, a compensator 126 that is part of comparator 20 (shown in FIG. 3) generates a compensation signal. Thus, the compensation signal is generated during a second portion of the period of sense voltage $V_{SENSE}$.

Figure 3:
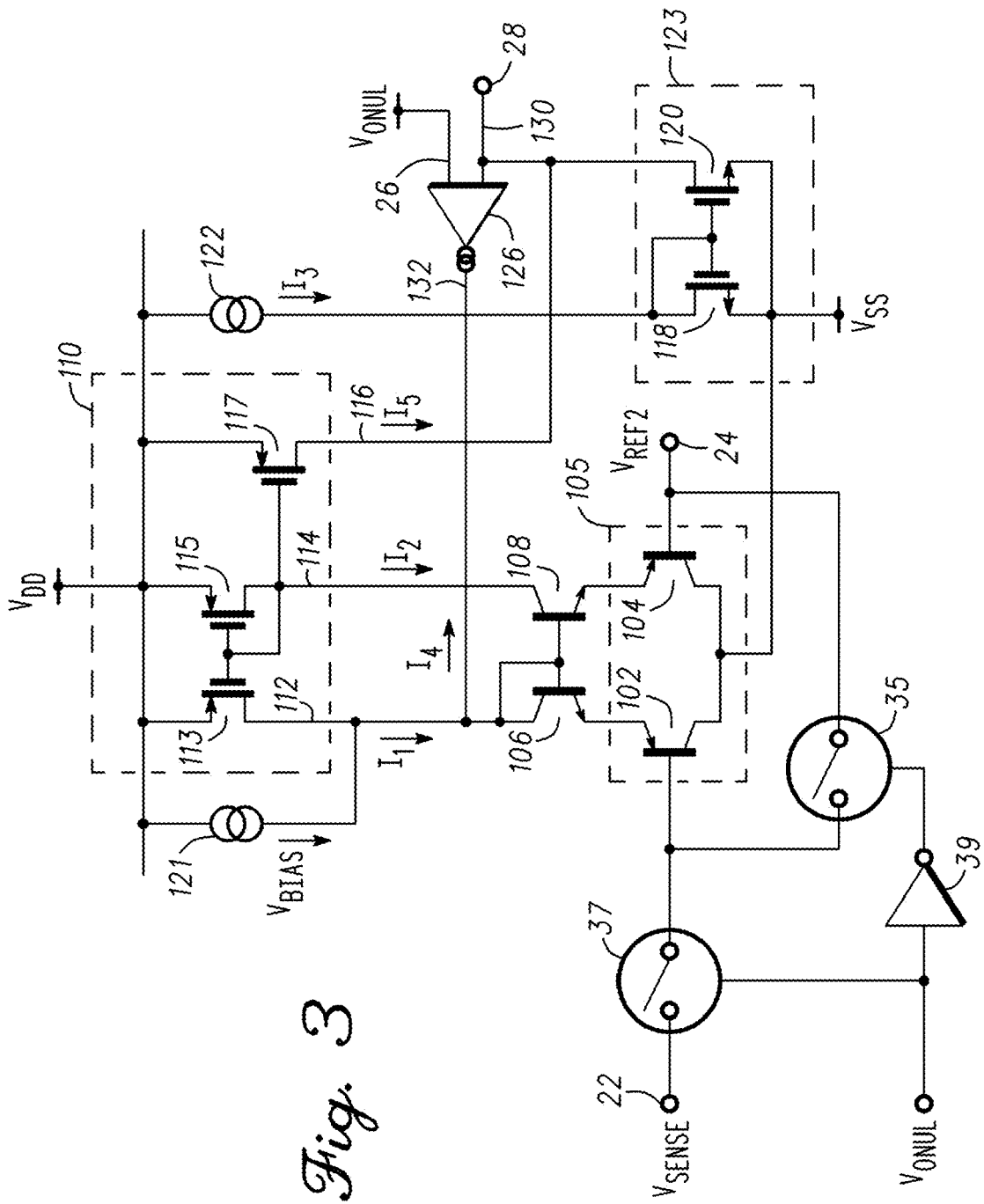
FIG. 3 is a circuit schematic of a comparator stage of the zero current detection circuit of FIG. 1.

FIG. 3 is a circuit schematic of comparator 20 in accordance with an embodiment of the present invention. What is shown in FIG. 3 is a pair of pnp bipolar transistors 102 and 104 coupled as a differential pair 105. PNP bipolar transistors have collector terminals commonly connected together and for receiving source of operating potential $V_{SS}$. The base terminal of pnp bipolar transistor 102 is coupled for receiving a sense signal or voltage $V_{SENSE}$ through a switch 37, the base terminal of pnp bipolar transistor 104 is coupled for receiving a reference voltage $V_{REF2}$, and for receiving sense signal $V_{SENSE}$ through switches 35 and 37, the emitter terminal of pnp bipolar transistor 102 is connected to the emitter terminal of an npn bipolar transistor 106, and the emitter terminal of pnp bipolar transistor 104 is connected to the emitter terminal of npn bipolar transistor 108. Switch 35 has a control terminal coupled for receiving offset nullification signal $V_{ONUL}$ through an inverter 39 and the control terminal of switch 37 is coupled from receiving offset nullification signal $V_{ONUL}$. Preferably voltage $V_{REF2}$ and operating potential $V_{SS}$ are equal to a ground potential, which is usually connected to the bulk or substrate of a silicon chip. This allows the formation of collectors of pnp bipolar transistors 102 an 104 from the bulk or silicon substrate. The base terminal of npn bipolar transistor 106 is commonly connected to its collector terminal, to the base terminal of npn bipolar transistor 108, and to an output terminal 112 of a current mirror 110. The collector terminal of npn bipolar transistor 108 is connected to an output terminal 114 of current mirror 110. It should be noted that it is preferable to use substrate pnp bipolar transistors because their collectors are connected to the substrate, which improves manufacturability. However, isolated pnp bipolar transistors also may be used which allows connection of the collector to a desired potential. The manufacture of isolated pnp bipolar transistors uses additional processing steps compared to the manufacture of substrate pnp bipolar transistors, which increases manufacturing costs.

By way of example, current mirror 110 comprises p-channel field effect transistors 113, 115, and 117, where their source terminals are commonly coupled together for receiving a source of operating potential $V_{DD}$. The gate terminal of p-channel field effect transistors 113 and 115 are commonly connected together and to the drain terminal of p-channel field effect transistor 115. The drain terminal of p-channel field effect transistor 113 serves as output terminal 112 of current mirror 110 and the commonly connected gate and drain terminals of p-channel field effect transistor 115 serve as output terminal 114 of current mirror 110. The gate terminal of p-channel field effect transistor 117 and the drain terminal and gate terminal of p-channel field effect transistor 115 are commonly connected together. The drain terminal of p-channel field effect transistor 117 serves as output terminal 116 of current mirror 110. A bias current source 121 has a terminal coupled for receiving source of operating potential $V_{DD}$ and a terminal connected to output terminal 112 of current mirror 110. Currents $I_2$ and $I_5$ are conducted through output terminals 114 and 116, respectively, of current mirror 110. By way of example, p-channel field effect transistors 113, 115, and 117 are sized so that the ratio of their areas is 1:2:2, respectively.

Comparator 20 further includes n-channel field effect transistors 118 and 120 having source terminals that are commonly connected together and for receiving a source of operating potential such as, for example, $V_{SS}$, and gate terminals commonly connected together and to the drain terminal of n-channel field effect transistor 118. The drain terminal of n-channel field effect transistor 118 is connected to a constant current source 122. Transistors 118 and 120 form a current mirror 123. A compensator 126 has an input terminal 26 (shown in FIGS. 1 and 3) coupled for receiving an offset nullification signal $V_{ONUL}$, an input terminal 130 commonly coupled to output terminal 116 of current mirror 110 and to the drain terminal of n-channel field effect transistor 120, and an output terminal 132 commonly connected to output terminal 112, to the collector terminal of npn bipolar transistor 106, and to the base terminals of npn bipolar transistors 106 and 108. Current $I_3$ is conducted from constant current source 122 to the commonly connected gate and drain terminals of n-channel field effect transistors 118 and 120 and a current $I_4$ is conducted toward output terminal 132 of compensator 126.

In operation, sense voltage $V_{SENSE}$ is applied to input terminal 22, i.e., to the base terminal of transistor 102 through switch 37. If voltage $V_{SENSE}$ is less than voltage $V_{REF2}$, then currents $I_2$ and $I_5$ are less than current $I_3$ so that the output voltage of comparator 20 is at a logic low voltage level. Current $I_5$ has the same value as current $I_2$ because the ratio of their source areas is 2:2. As voltage $V_{SENSE}$ increases, currents $I_1$, $I_2$, and $I_5$ also increase. Current $I_3$ is a constant current and is mirrored by current mirror 123. The voltage at output terminal 28 of comparator 20 is in equilibrium when currents $I_1$, $I_2$, and $I_3$ are substantially equal to each other. Current $I_1$ is the sum of bias current $I_{BIAS}$ and the current flowing out of output terminal 112 of current mirror 110. Preferably, constant current source 121 is designed such that current $I_1$ is greater than current $I_2$ when the voltages at input terminals 22 and 24 of pnp bipolar transistors 102 and 104 are substantially the same, i.e., current $I_2$ is greater than needed for zero offset. Thus, comparator 20 initially has a negative offset, e.g., an offset of about 20 millivolts.

When current $I_2$ is greater than current $I_3$, i.e., the occurrence of a turn-off event, comparator 20 detects the turn-off event, signal $V_{ONUL}$ at input terminal 26 is at a logic low voltage level and comparator 20 enters an offset nullification operating mode. It should be noted that after turn-off comparator 20 detects the turn-off event, signal $V_{ONUL}$ transitions to a logic low voltage level. In accordance with an embodiment of the present invention, voltage $V_{SENSE}$ at sensing node 31 is connected to the base of pnp bipolar transistor 102, i.e., at input terminal 22 (shown in FIGS. 1 and 3) when switch 37 is closed (and switch 35 is open) and that the bases of pnp bipolar transistors 102 and 104, i.e., terminals 22 and 24 (shown in FIGS. 1 and 3) are shorted together when switch 35 is closed (and switch 37 is open). In response to voltage $V_{SENSE}$ being substantially the same as voltage $V_{REF2}$, comparator 20 would ideally be in an equilibrium state where the output voltage at output terminal 28 is substantially equal to about one-half the value of supply voltage $V_{DD}$. However, because current $I_1$ is larger than needed for zero offset, the output of comparator 20 is in a high saturation state. Compensator 126 detects the high saturation state and starts to sink a current $I_4$ to bring comparator 20 into equilibrium. Thus current $I_4$ changes the turn-off threshold of comparator 20 and balances its input offset voltage. By way of example, current $I_4$ increases the turn-off threshold of comparator 20. The value of current $I_4$ is stored in a track and hold system identified by reference character 156 in FIG. 4 so that when signal $V_{ONUL}$ transitions to a logic high voltage level, i.e., when comparator 20 is sensing the drain voltage of SR MOSFET 50 (shown in FIG. 1), compensator 126 is still sinking current $I_4$ to maintain comparator 20 with zero offset. Current $I_4$ is referred to as a compensation signal.

Figure 4:
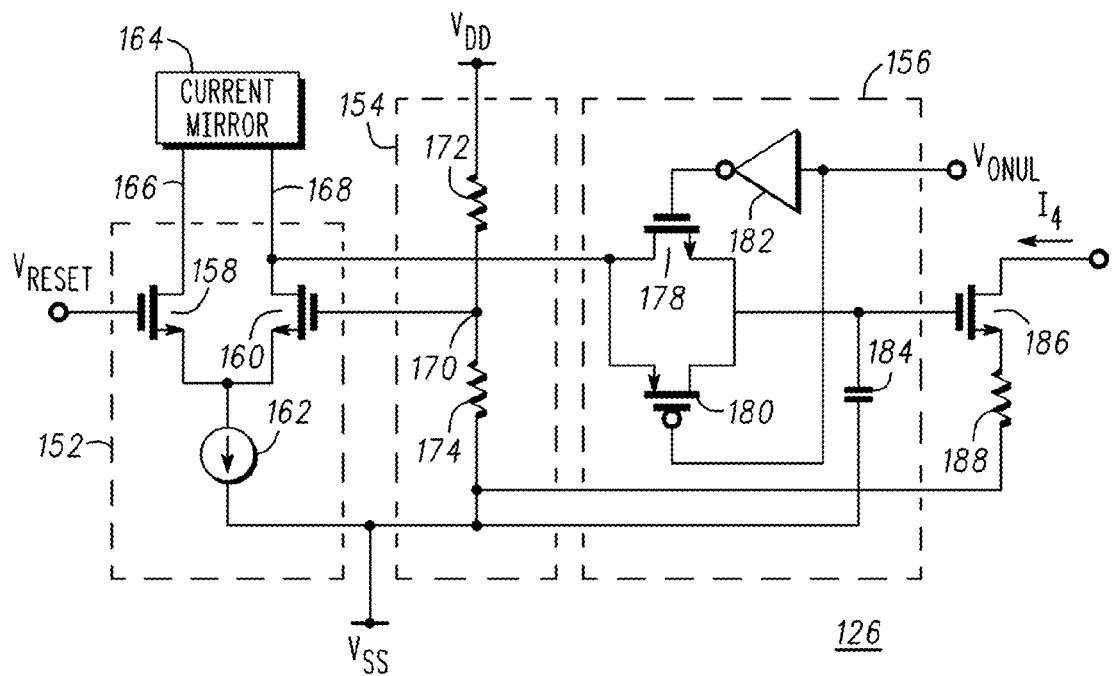
FIG. 4 is a circuit schematic of a compensator stage of the zero current detection circuit of FIG. 1.

FIG. 4 is a schematic diagram of compensator 126 in accordance with an embodiment of the present invention. What is shown in FIG. 4 is an error amplifier 152 coupled to a track and hold system 156 and a voltage divider circuit 154. More particularly, error amplifier 152 comprises a pair of n-channel field effect transistors 158 and 160 coupled in a common source differential pair configuration. The source terminals of n-channel field effect transistors 158 and 160 are commonly connected together and to a current source 162. N-channel field effect transistors 158 and 160 form an input stage of compensator 126. The drain terminals of n-channel field effect transistors 158 and 160 are connected to output terminals 166 and 168, respectively, of a current mirror 164. The gate terminal of n-channel field effect transistor 158 is coupled to output terminal 28 of turn-off comparator 20 for receiving an input signal $V_{RESET}$ and the gate terminal of n-channel field effect transistor 160 is connected to a node 170 formed by the connection of resistors 172 and 174 of voltage divider circuit 154. Terminals of resistors 172 and 174 are connected together to form node 170 and the other terminals of resistors 172 and 174 are coupled for receiving sources of operating potential $V_{DD}$ and $V_{SS}$, respectively.

Track and hold system 156 comprises an n-channel field effect transistor 178 and a p-channel field effect transistor 180, wherein the drain terminal of n-channel field effect transistor 178 is commonly connected to the source terminal of p-channel field effect transistor 180 and to terminal 168 of current mirror 164 and to the drain terminal of n-channel field effect transistor 160 and the source terminal of n-channel field effect transistor 178 is connected to the drain terminal of p-channel field effect transistor 180. The gate terminal of p-channel field effect transistor 180 is connected to an input terminal of an inverter 182 and the gate terminal of n-channel field effect transistor 178 is connected to the output terminal of inverter 182. The input terminal of inverter 182 is coupled for receiving offset nullification signal $V_{ONUL}$, which is also referred to as a hold signal. The source terminal of n-channel field effect transistor 178 and the drain terminal of p-channel field effect transistor 180 are connected to the gate terminal of an n-channel field effect transistor 186 and to a terminal of a capacitor 184. The other terminal of capacitor 184 is coupled for receiving a source of operating potential such as, for example, $V_{SS}$. The source terminal of n-channel field effect transistor 186 is coupled for receiving source of operating potential $V_{SS}$ through a resistor 188 and the drain terminal of n-channel field effect transistor 186 serves as an output terminal for compensator 126 through which current I4 flows. By way of example, source of operating potential is ground.

In operation, the gate terminal of field effect transistor 160 receives a voltage substantially equal to one-half of the supply voltage $V_{DD}$ and the gate terminal of field effect transistor 158 is connected to input terminal 130 of compensator 126. Error amplifier 152 generates a current that charges capacitor 184 which places turn off comparator 20 in equilibrium. Current I4 is generated by the voltage on the gate terminal of n-channel field effect transistor 186. The voltage at the gate terminal of n-channel field effect transistor 186 is set so that the voltage at output terminal 28 of comparator 20 is equal to the voltage at the gate terminal of field effect transistor 160, e.g., one-half of the supply voltage $V_{DD}$. When comparator 20 is in an inactive mode, the voltage at terminal 168 appears at the gate terminal of n-channel field effect transistor 186 causing it to generate compensation current I4. When comparator 20 enters the active mode, transistors 178 and 180 are biased to block the voltage at terminal 168 from being received by the gate terminal of n-channel field effect transistor 186. Under this condition, capacitor 184 provides the gate voltage for n-channel field effect transistor 186 which enables it to generate current I4. Thus, n-channel field effect transistor 186 operates as a voltage controlled current source. Current I4 has the same value because the voltage on the gate terminal of transistor 186 is still the same voltage value representing the zero offset voltage.

By now it should be appreciated that a method for detecting a current and nullifying an input offset voltage and a circuit suitable for detecting the current and nullifying the input offset voltage have been provided. An advantage of circuits in accordance with embodiments of the present invention is that a voltage level shifter 30, e.g., a resistor, that is external to the semiconductor chip containing comparators 12 and 20, logic circuit 32, current source 33, and driver 46 can be used to shift the turn-off threshold voltage without including an additional input/output pin. In addition, this allows the capability of selecting the turn-off current. In addition, embodiments of the present invention allow dynamically compensating the input offset voltage of the turn-off comparator, e.g., comparator 20.

Another advantage is that the input offset voltage of the turn-off comparator is independent of temperature.

Although specific embodiments have been disclosed herein, it is not intended that the invention be limited to the disclosed embodiments. Those skilled in the art will recognize that modifications and variations can be made without departing from the spirit of the invention. For example, the input offset voltage of the turn-on comparator 12 can be dynamically compensated by manufacturing comparator 12 using a similar circuit architecture as comparator 20. It is intended that the invention encompass all such modifications and variations as fall within the scope of the appended claims.

What is claimed is:

1. A method for compensating for an offset voltage, comprising:
generating a first voltage at a first node;
generating a first comparison signal at a second node by comparing the first voltage to a first reference voltage;
generating a second comparison signal at a third node in response to an activation signal in a first state appearing at a fourth node by comparing the first voltage to a second reference voltage; and
dynamically generating a compensation signal for the input offset voltage of at least one of the first and second comparators in response to the activation signal appearing at the fourth node being in a second state.

2. The method of claim 1, wherein generating the compensation signal comprises generating a first current.

3. The method of claim 2, further including charging a capacitor and using a voltage stored across the capacitor to generate the compensation signal.

4. The method of claim 3, further including using the charge from the capacitor to compensate for the offset voltage in response to the activation signal being in the first state.

5. The method of claim 2, further including using the first current to change a turn-off threshold of a comparator that generates the second comparison signal.

6. The method of claim 5, wherein changing the turn-off threshold of the comparator includes increasing its turn-off threshold.

7. The method of claim 1, wherein generating the compensation signal includes balancing an input offset voltage of a comparator.

8. The method of claim 1, wherein generating the first comparison signal occurs during a first portion of a period of a sense signal.

9. The method of claim 8, wherein generating the compensation signal occurs during a second portion of the period of the sense signal.

10. A method for compensating for an offset voltage, comprising:
providing first and second comparators, the first comparator having first and second input terminals and an output terminal and the second comparator having first, second, and third input terminals and an output terminal;
sensing a first voltage at the first terminal of the first comparator and at the second terminal of the second comparator during a first portion of a period of a sense signal; and
generating an offset compensation signal at the third input terminal of the second comparator during a second portion of the period of the sense signal.

11. The method of claim 10, wherein sensing the first voltage at the first terminal of the first comparator and at the second terminal of the second comparator includes comparing the first voltage at the first terminal of the first comparator with a first reference voltage and comparing the first voltage at the second terminal of the second comparator with a second reference voltage.

12. The method of claim 11, wherein the first and second reference voltages have substantially the same value.

13. The method of claim 10, wherein generating the offset compensation signal includes generating a first current in response to a second current being greater than a third current.

14. The method of claim 13, further including using a voltage stored across an energy storage device to generate the first current.

15. The method of claim 14, further including using charge from the energy storage device during the first portion of the period of the sense signal to compensate for an offset voltage of the second comparator.

16. The method of claim 15, further including using the first current to increase the turn-off threshold of the second comparator.

17. The method of claim 16, further including using a resistor and a fifth current to generate the first voltage.

18. The method of claim 17, wherein using the resistor and the fifth current to generate the first voltage includes generating the first voltage to be one of greater than a reference voltage received at the second terminal of the first comparator or less than the reference voltage.

19. A compensation circuit, comprising:
  a first comparator having first and second input terminals and an output terminal;
  a second comparator having first, second, and third input terminals and an output terminal, the first terminal of the first comparator coupled to the second terminal of the second comparator, the second terminal of the first comparator coupled for receiving a first reference voltage, and the first terminal of the second comparator coupled for receiving a second reference voltage;
  a first logic circuit having first and second input terminals and an output terminal and comprising a latch having first and second inputs and an output, the first input terminal coupled to the output terminal of the first comparator, the second input terminal coupled to the output terminal of the second comparator, and the output terminal of the logic circuit coupled to the third input terminal of the second comparator, the output of the latch serving as the output terminal of the first logic circuit; and
  a driver circuit having an input terminal and an output terminal, the input terminal coupled to the output terminal of the logic circuit.

20. The compensation circuit of claim 19, further including a resistor coupled to the first input terminal of the first comparator and to the second input terminal of the second comparator.

21. The compensation circuit of claim 19, wherein the first logic circuit further includes a first one shot coupled between the output of the first comparator and the first input of the latch.

22. The compensation circuit of claim 21, wherein the first logic circuit further includes a second one shot coupled between the output of the second comparator and the second input of the latch.

23. A compensation circuit, comprising:
  a first comparator having first and second input terminals and an output terminal;
  a second comparator having first, second, and third input terminals and an output terminal, the first terminal of the first comparator coupled to the second terminal of the second comparator, the second terminal of the first comparator coupled for receiving a first reference voltage, and the first terminal of the second comparator coupled for receiving a second reference voltage, wherein the second comparator comprises:
    a first transistor having a control terminal and first and second current carrying terminals;
    a second transistor having a control terminal and first and second current carrying terminals, wherein the first and second current carrying terminals of the first and second transistors are commonly connected together;
    a current mirror, wherein the second current carrying terminals of the first and second transistors are coupled to the current mirror;
  a level shifting stage having a terminal coupled to the current mirror;
  a compensator having first and second input terminals and an output terminal,
  wherein the compensator comprises:
    an input stage;
    a voltage divider stage coupled to the input stage; and
    a track and hold stage coupled to the voltage divider stage and to the input stage.

24. The compensation circuit of claim 23, wherein the first logic circuit comprises a latch having set and reset inputs and an output, the set input coupled to the output of the first comparator, the reset input coupled to the output of the second comparator, and the output serving as the output of the first logic circuit.

25. The compensation circuit of claim 24, wherein the first logic circuit further comprises a first one shot coupled to the latch.

26. The compensation circuit of claim 24, wherein the first logic circuit further comprises a first one shot coupled between the output of the first comparator and the set input of the latch.

27. The compensation circuit of claim 26, wherein the first logic circuit further comprises a second one shot coupled between the output of the second comparator and the reset input of the latch.

28. A compensation circuit, comprising:
  a first comparator having first and second input terminals and an output terminal;
  a second comparator having first, second, and third input terminals and an output terminal, the first terminal of the first comparator coupled to the second terminal of the second comparator, the second terminal of the first comparator coupled for receiving a first reference voltage, and the first terminal of the second comparator coupled for receiving a second reference voltage;
  a first logic circuit having first and second input terminals and an output terminal, the first logic circuit comprising a first one shot, wherein the first input terminal is coupled to the output terminal of the first comparator, the second input terminal is coupled to the output terminal of the second comparator, and the output terminal of the logic circuit is coupled to the third input terminal of the second comparator; and
  a driver circuit having an input terminal and an output terminal, the input terminal coupled to the output terminal of the logic circuit.

29. The compensation circuit of claim 28, wherein the first logic circuit further comprises a second one shot, the first one shot coupled to the output terminal of the first comparator and the second one shot coupled to the output terminal of the second comparator.

* * * * *